United States Patent
Fung

(10) Patent No.: US 9,543,209 B2
(45) Date of Patent: Jan. 10, 2017

(54) NON-PLANAR TRANSISTORS WITH REPLACEMENT FINS AND METHODS OF FORMING THE SAME

(71) Applicant: Taiwan Semiconductor Manufacturing Company, Ltd., Hsin-Chu (TW)

(72) Inventor: Ka-Hing Fung, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/864,037

(22) Filed: Sep. 24, 2015

(65) Prior Publication Data

US 2016/0013106 A1    Jan. 14, 2016

Related U.S. Application Data

(62) Division of application No. 13/924,364, filed on Jun. 21, 2013, now Pat. No. 9,178,043.

(51) Int. Cl.
| | |
|---|---|
| H01L 21/8234 | (2006.01) |
| H01L 29/66 | (2006.01) |
| H01L 21/84 | (2006.01) |
| H01L 29/78 | (2006.01) |
| H01L 29/10 | (2006.01) |

(52) U.S. Cl.
CPC ......... *H01L 21/823412* (2013.01); *H01L 21/823431* (2013.01); *H01L 21/823481* (2013.01); *H01L 21/845* (2013.01); *H01L 29/1054* (2013.01); *H01L 29/66795* (2013.01); *H01L 29/66818* (2013.01); *H01L 29/7853* (2013.01)

(58) Field of Classification Search
CPC ............... H01L 21/823431; H01L 21/823821; H01L 21/845; H01L 29/66795
USPC ........................................................ 438/283
See application file for complete search history.

(56) References Cited

U.S. PATENT DOCUMENTS

| | | | |
|---|---|---|---|
| 7,326,634 B2 | 2/2008 | Lindert et al. | |
| 8,283,653 B2 | 10/2012 | Pillarisetty et al. | |
| 8,716,156 B1 * | 5/2014 | Pawlak et al. | 438/792 |
| 2014/0170839 A1 * | 6/2014 | Brunco | 438/479 |

* cited by examiner

Primary Examiner — Yu-Hsi D Sun
(74) Attorney, Agent, or Firm — Slater Matsil, LLP

(57) ABSTRACT

A method includes forming a first semiconductor fin, and oxidizing surface portions of the first semiconductor fin to form a first oxide layer. The first oxide layer includes a top portion overlapping the first semiconductor fin and sidewall portions on sidewalls of the first semiconductor fin. The top portion of the first oxide layer is then removed, wherein the sidewall portions of the first oxide layer remains after the removing. The top portion of the first semiconductor fin is removed to form a recess between the sidewall portions of the first oxide layer. An epitaxy is performed to grow a semiconductor region in the recess.

20 Claims, 20 Drawing Sheets

NON-PLANAR TRANSISTORS WITH REPLACEMENT FINS AND METHODS OF FORMING THE SAME

PRIORITY CLAIM AND CROSS-REFERENCE

This application is a divisional of U.S. patent application Ser. No. 13/924,364, entitled "Non-Planar Transistors with Replacement Fins and Methods of Forming the Same," filed on Jun. 21, 2013, which application is incorporated herein by reference.

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Germanium is a commonly known semiconductor material. The electron mobility and hole mobility of germanium are greater than that of silicon, which is the most commonly used semiconductor material in the formation of integrated circuits. Hence, germanium is an excellent material for forming integrated circuits. In the past, however, silicon gained more popularity since its oxide (silicon oxide) is readily usable in the gate dielectrics of MOS transistors. The gate dielectrics of the MOS transistors can be conveniently formed by thermally oxidizing silicon substrates. The oxide of germanium, on the other hand, is soluble in water, and hence is not suitable for the formation of gate dielectrics.

With the use of high-k dielectric materials in the gate dielectrics of the MOS transistors, however, the convenience provided by the silicon oxide is no longer a big advantage, and hence germanium is reexamined for use in the formation of MOS transistors.

In addition to germanium, compound semiconductor materials of group III and group V elements (referred to as III-V compound semiconductors hereinafter) are also good candidates for forming NMOS devices for their high electron mobility.

A challenge faced by the semiconductor industry is that it is difficult to form germanium films with high germanium concentrations, pure germanium films, and III-V compound semiconductor films. Particularly, it is difficult to form high-concentration germanium or III-V films with low defect densities and great thicknesses. Previous research has revealed that when a silicon germanium film is epitaxially grown from a blank silicon wafer, the critical thickness of the silicon germanium film reduces with the increase in the percentage of germanium in the silicon germanium film, wherein the critical thickness is the maximum thickness the silicon germanium film can reach without being relaxed. When relaxation occurs, the lattice structure will be broken, and defects will be generated. For example, when formed on blank silicon wafers, the critical thickness of a silicon germanium film with a 20 percent germanium percentage may be only about 10 nm to about 20 nm. To make things worse, when the germanium percentage increases to 40, 60, and 80 percent, the critical thicknesses are further reduced to about 6-8 nm, 4-5 nm, and 2-3 nm, respectively. When the thickness of germanium films exceeds the critical thickness, the number of defects increases significantly. Accordingly, it is not feasible to form germanium or III-V compound semiconductor films on blank silicon wafers for the purpose of forming MOS transistors, particularly fin field-effect transistors (FinFETs).

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An integrated circuit structure comprising Fin Field-Effect Transistors (FinFETs) and the method of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 1:
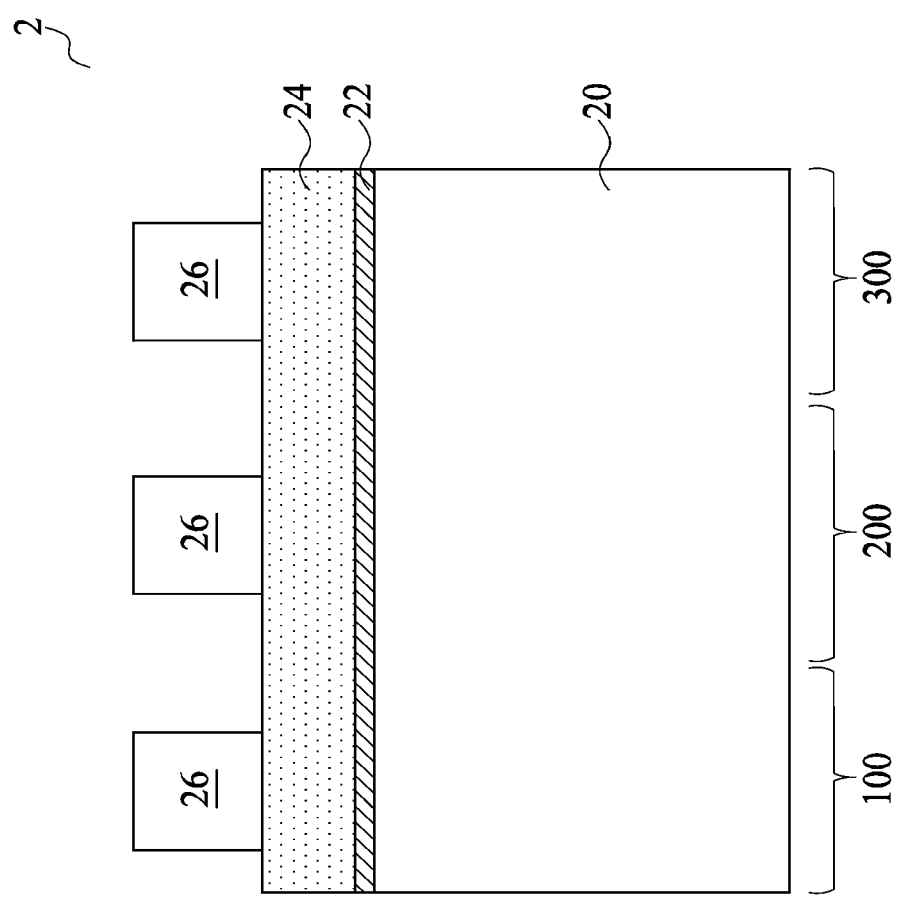
FIGS. 1 through 20 are cross-sectional views of intermediate stages in the manufacturing of Fin Field-Effect Transistors (FinFETs) in accordance with some exemplary embodiments.

Referring to FIG. 1, semiconductor substrate 20, which is a part of semiconductor wafer 2, is provided. In some embodiments, semiconductor substrate 20 includes crystalline silicon. Other commonly used materials such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate. In some exemplary embodiments, semiconductor substrate 20 comprises $Si_{1-z}Ge_z$, wherein value z is the atomic percentage of germanium in SiGe, and may be any value ranging from, and including, 0 and 1. When value z is 0, semiconductor substrate 20 is a crystalline silicon substrate. When value z is 1, semiconductor substrate 20 is a crystalline germanium substrate. Substrate 20 may also have a compound structure including a buffer III-V compound semiconductor on a silicon substrate, or a silicon germanium (or germanium) layer on a silicon substrate.

Semiconductor substrate 20 includes portions in regions 100, 200, and 300. In accordance with some embodiments, regions 100, 200, and 300 include a low-Vdd N-type Field-Effect Transistor (NFET) region, a low-Vdd P-type Field-Effect Transistor (PFET) region, and a high-Vdd NFET region, respectively. The devices in regions 100 and 200 are supplied with a positive power supply voltage Vdd1 lower than the positive power supply voltage Vdd2 of the devices in region 300. For example, power supply voltage Vdd1 may be lower than about 1V, and power supply voltage Vdd2 may be between about 1.2V and about 3.3V. In some embodiments, regions 100 and 200 are core (logic) regions, and region 300 is an input/output (IO) region. The FinFETs 170 and 270 (FIG. 20) may hence be core FinFETs, and FinFET 370 may be an IO FinFET.

Pad layer 22 and mask layer 24 are formed on semiconductor substrate 20. Pad layer 22 may be a thin film comprising silicon oxide formed, for example, using a thermal oxidation process or Chemical Vapor Deposition (CVD). The thickness of pad oxide layer 22 may be between about 10 Å and about 100 Å. It is appreciated, however, that the values recited throughout the description are merely examples, and may be changed to different values. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed using thermal nitridation of silicon, Plasma Enhanced Chemical Vapor Deposition (PECVD), or the like. The thickness of mask layer 24 may be between about 100 Å and about 1,000 Å. Mask layer 24 is used as a hard mask during subsequent photolithography processes. Photo resist 26 is formed on mask layer 24 and is then patterned.

Figure 2:
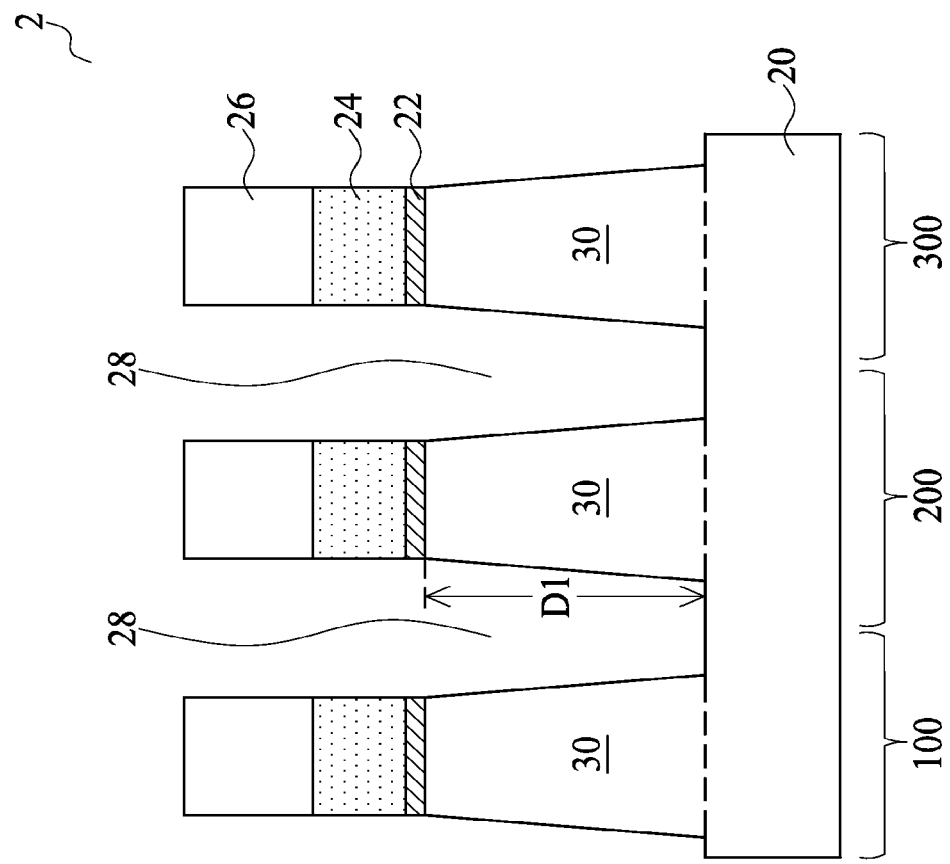

Referring to FIG. 2, mask layer 24 and pad layer 22 are etched through photo resist 26, exposing underlying semiconductor substrate 20. The exposed semiconductor substrate 20 is then etched, forming trenches 28. The portions of semiconductor substrate 20 between neighboring trenches 28 form semiconductor strips 30. In some exemplary embodiments, sidewalls 30A of semiconductor strips 30 have (110) planes. Trenches 28 may be trench strips (when viewed in the top view of wafer 2) that are parallel to each other. The depth D1 of trenches 28 may be between about 200 Å and about 1,000 Å. After etching semiconductor substrate 20, photo resist 26 is removed. Next, a cleaning step may be performed to remove a native oxide of semiconductor substrate 20. The cleaning may be performed using diluted hydrofluoric (HF) acid, for example.

Figure 3:
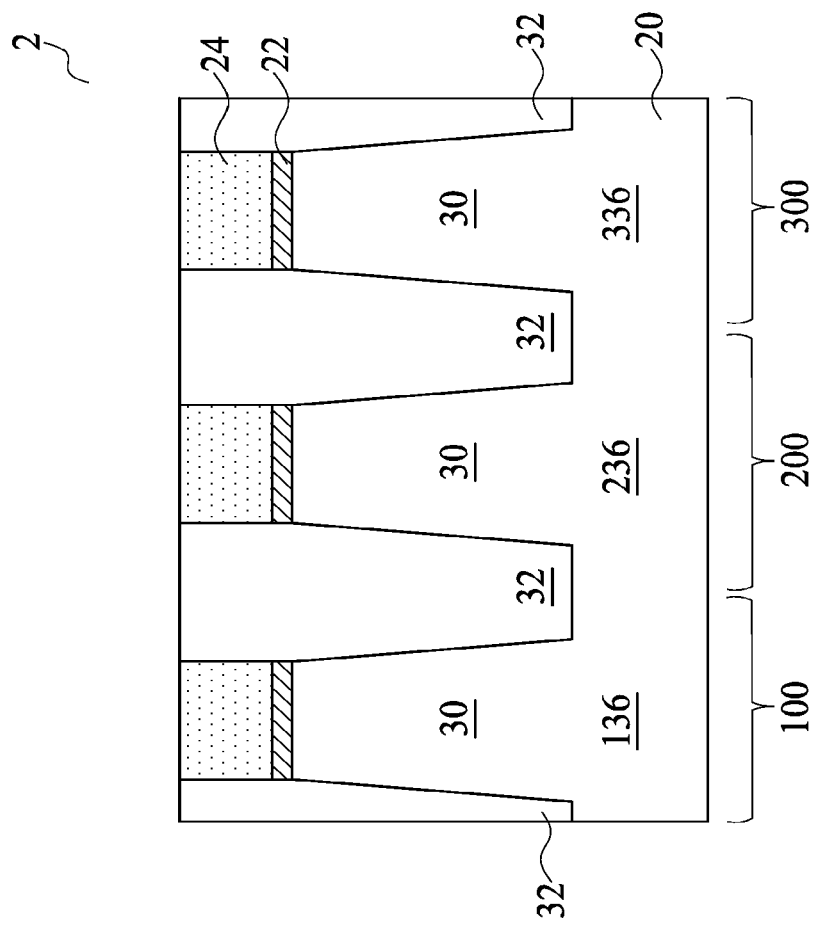

Next, trenches 28 are filled with dielectric materials to form Shallow Trench Isolation (STI) regions 32, as shown in FIG. 3. In accordance with some embodiments, the formation of STI regions 32 includes forming a liner oxide (not shown), and then filling the remaining portions of trenches 28 with a dielectric material, wherein the liner oxide and the dielectric material in combination form STI regions 32. The liner oxide may be a conformal layer whose horizontal portions and vertical portions have thicknesses close to each other. For example, the liner oxide may be a thermal oxide (such as silicon dioxide) having a thickness between about 10 Å and about 40 Å. In some embodiments, the liner oxide is formed using In-Situ Steam Generation (ISSG), with water steam or a combined gas of hydrogen ($H_2$) and oxygen ($O_2$) used to oxidize semiconductor strips 30, The ISSG oxidation may be performed at an elevated temperature. The dielectric regions may be formed, for example, using a method selected from spin-on coating, Flowable Chemical Vapor Deposition (FCVD), and the like.

A planarization such as Chemical Mechanical Polish (CMP) is then performed, as shown in FIG. 3, and hence STI regions 32 have top surfaces level with the top surfaces of mask layer 24. Mask layer 24 may be used as the CMP stop layer in the planarization.

Figure 4:
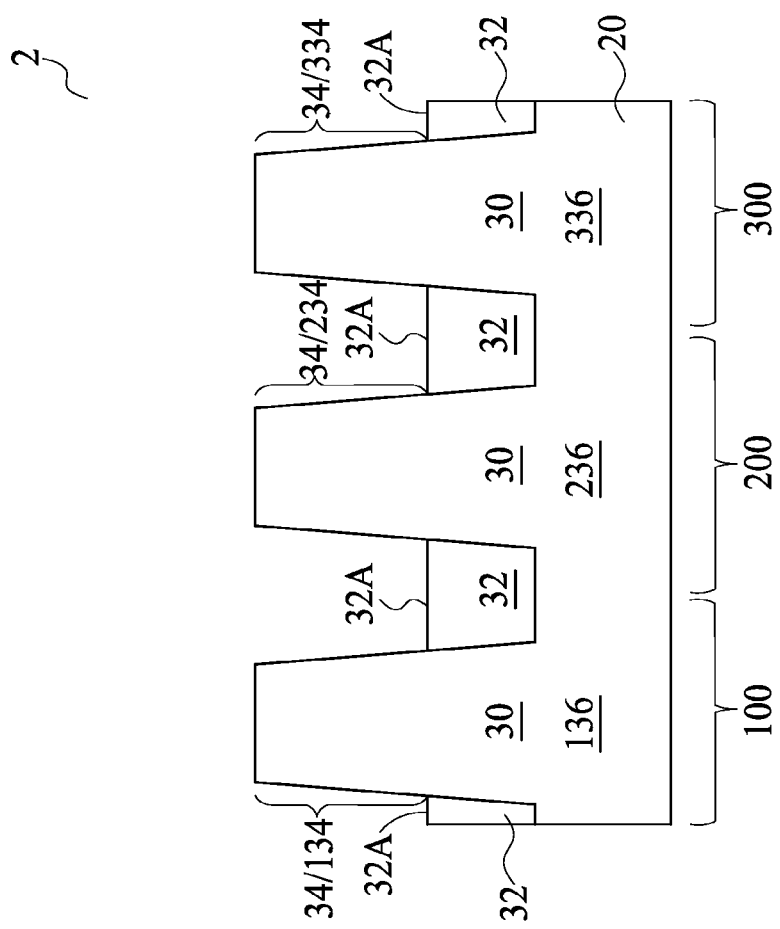

FIG. 4 illustrates the removal of mask layer 24 and pad oxide layer 22 as in FIG. 3, and the recessing of STI regions 32. Mask layer 24, if formed of silicon nitride, may be removed by a wet process using hot $H_3PO_4$. Pad oxide layer 22 may be removed using diluted HF. Next, STI regions 32 are recessed, for example, through an etching step, wherein diluted HF, SiCoNi (including HF and $NH_3$), or the like, may be used as the etchant. The portions of semiconductor strips 30 that are higher than top surfaces 32A of STI regions 32 are referred to as semiconductor fins 34 hereinafter, wherein semiconductor fins 34 include fins 134, 234, and 334 in regions 100, 200, and 300, respectively.

Figure 5:
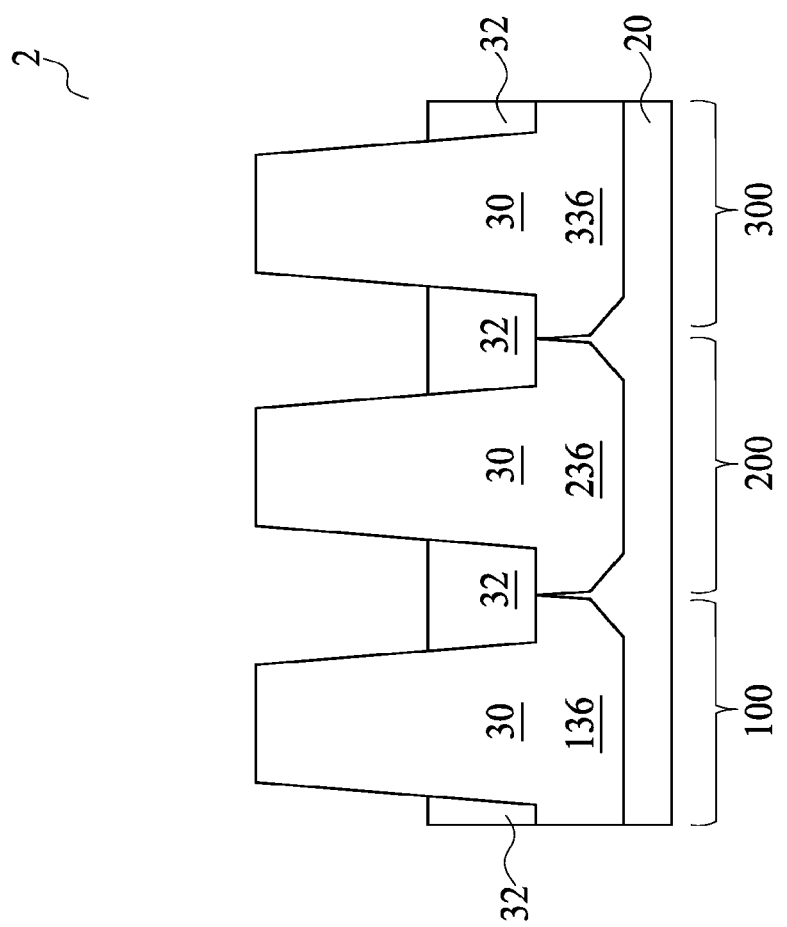

Referring to FIG. 5, well regions 136, 236, and 336 are formed. In accordance with some embodiments, well regions 136, 236, and 336 are of p-type, n-type, and p-type, respectively. The formation of well regions 136 and 336 may include implanting a p-type impurity such as boron. The dosage may be between about $1E13/cm^2$ and about $2E14/cm^2$, although different dosages may be used. The implantation energy may be between about 10 KeV and about 100 KeV. The formation of well region 236 may include implanting an n-type impurity such as phosphorus or arsenic. The dosage may be between about $1E13/cm^2$ and about $2E14/cm^2$, although different dosages may be used. The implantation energy may also be between about 10 KeV and about 100 KeV.

Figure 6:
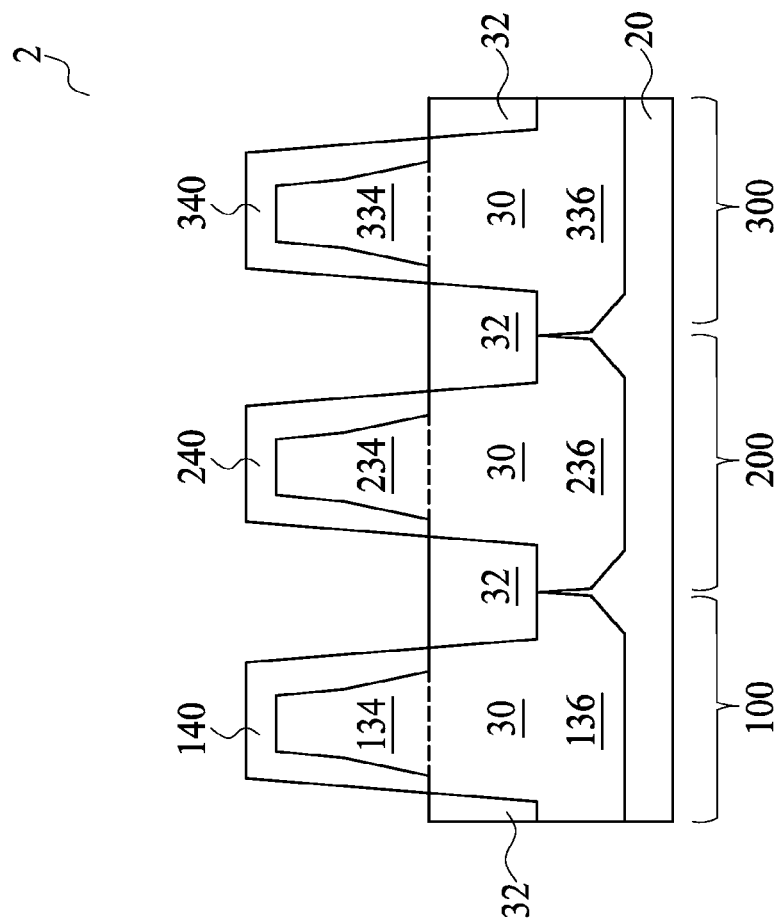

Referring to FIG. 6, thick oxide layers 140, 240, and 340 are formed on fins 134, 234, and 334, respectively. In accordance with some embodiments, the formation includes a high-temperature process performed at a temperature higher than about 900° C. For example, the formation process may include a local thermal oxidation of fins 134/234/334 in an oxygen ($O_2$) containing environment, so that the surface layers of fins 134, 234, and 334 are oxidized. The oxidation temperature may be between about 800° C. and about 1,100° C. The oxidation time may be between about 10 seconds and about 10 minutes. As a result of the oxidation, fins 134, 234, and 334 are reshaped, and their corners are rounded, which is beneficial for the performance and manufacturability of the resulting FinFETs.

Figure 7:
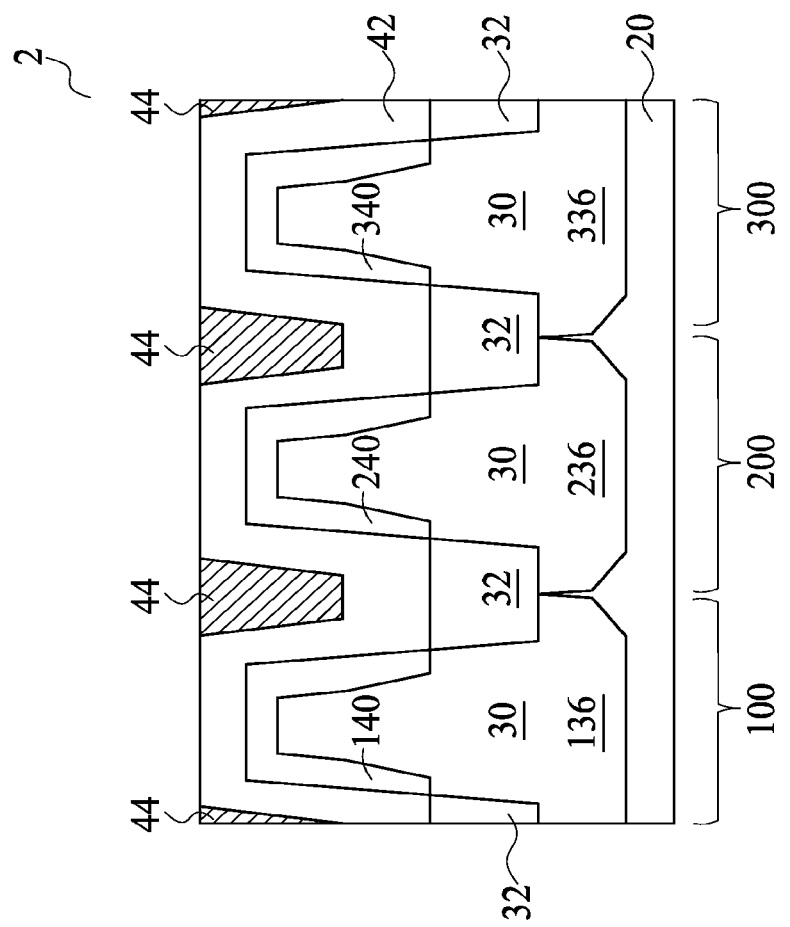

FIG. 7 illustrates the formation of hard mask layer 42 and oxide regions 44. In some embodiments, hard mask layer 42 comprises silicon nitride, although other materials such as silicon oxynitride, silicon carbide, or the like, may also be used. The thickness of hard mask layer 42 may be between about 50 Å and about 500 Å, although different thicknesses may be used. Oxide regions 44 may be formed as a blanket layer, and may comprise silicon oxide. A planarization such as a CMP is performed, so that a planar top surface is formed, which planar top surface comprises the top surfaces of hard mask layer 42 and the top surfaces of oxide regions 44.

Figure 8:
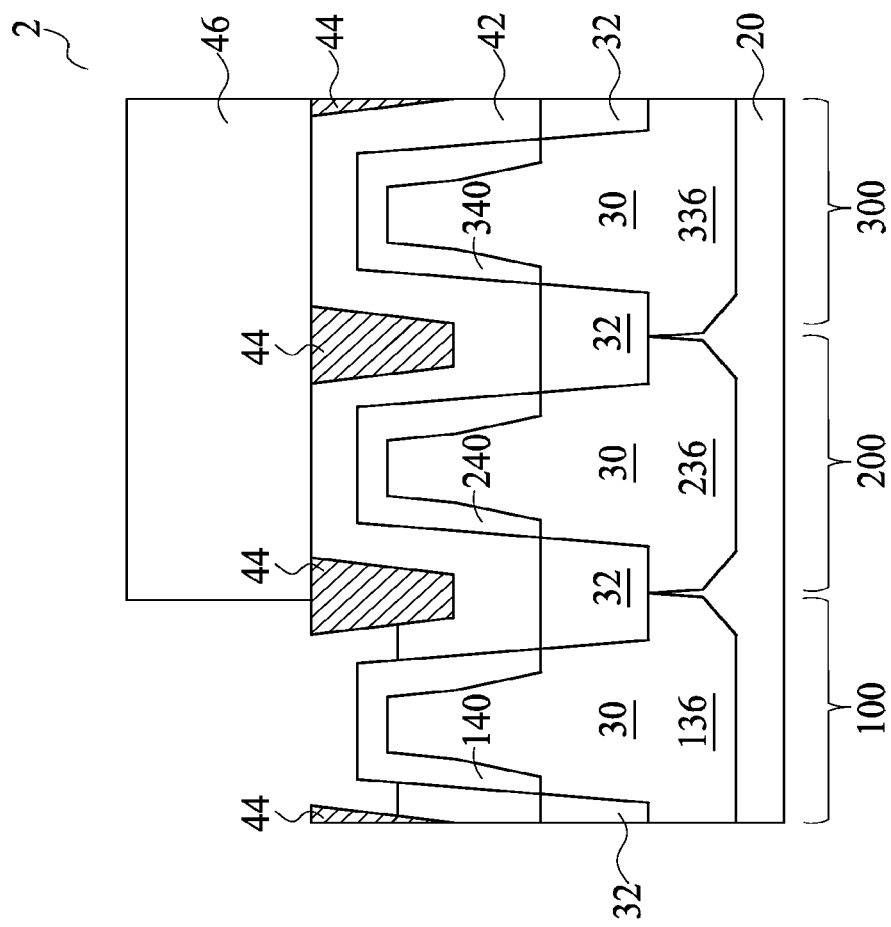

FIG. 8 illustrates the formation of photo resist 46, which covers regions 200 and 300, while region 100 is not covered. Next, an etching step is performed to remove the exposed portions of hard mask layer 42. The etching may be performed using an etchant attacking silicon nitride, but not attacking oxide regions 44 and oxide layer 140. As a result, oxide layer 140 is exposed. The etching may adopt an anisotropic etching method such as a dry etching method.

Figure 9:
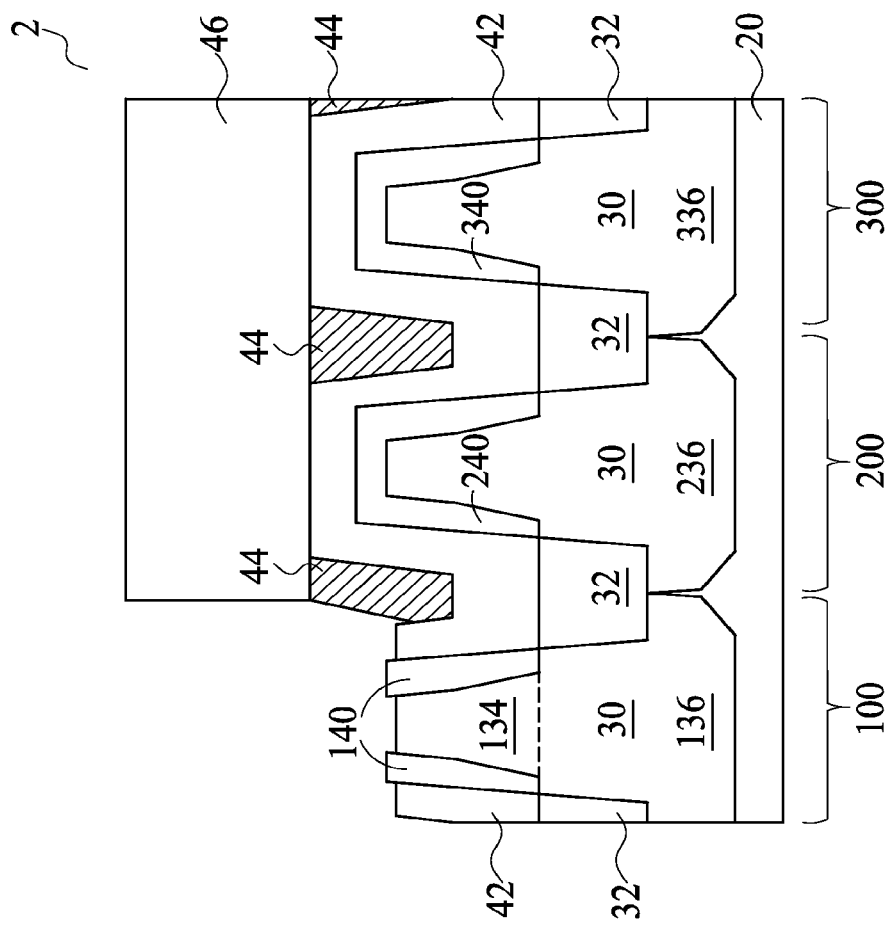
Figure 10:
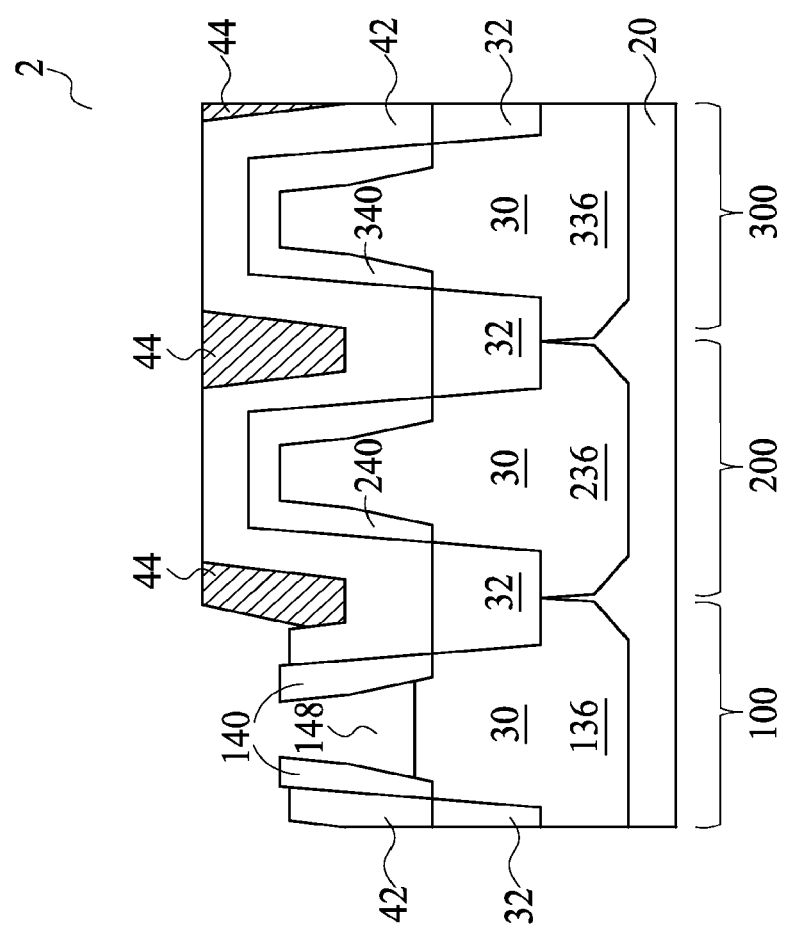

Next, referring to FIG. 9, an anisotropic etching method is used to etch the exposed portions of oxides, which include the top portion of oxide layer 140 that covers fin 134 and possibly some portions of oxide regions 44. At least the majority, and possibly an entirety, of the sidewall portions of oxide layer 140, however, is not removed. As a result, fin 134 is exposed. The exposed fin 134 is then etched, forming recess 148 between opposite sidewall portions of oxide layer 140, which is shown in FIG. 10. After the formation of recess 148, photo resist 46 (FIG. 9) is removed.

Figure 11:
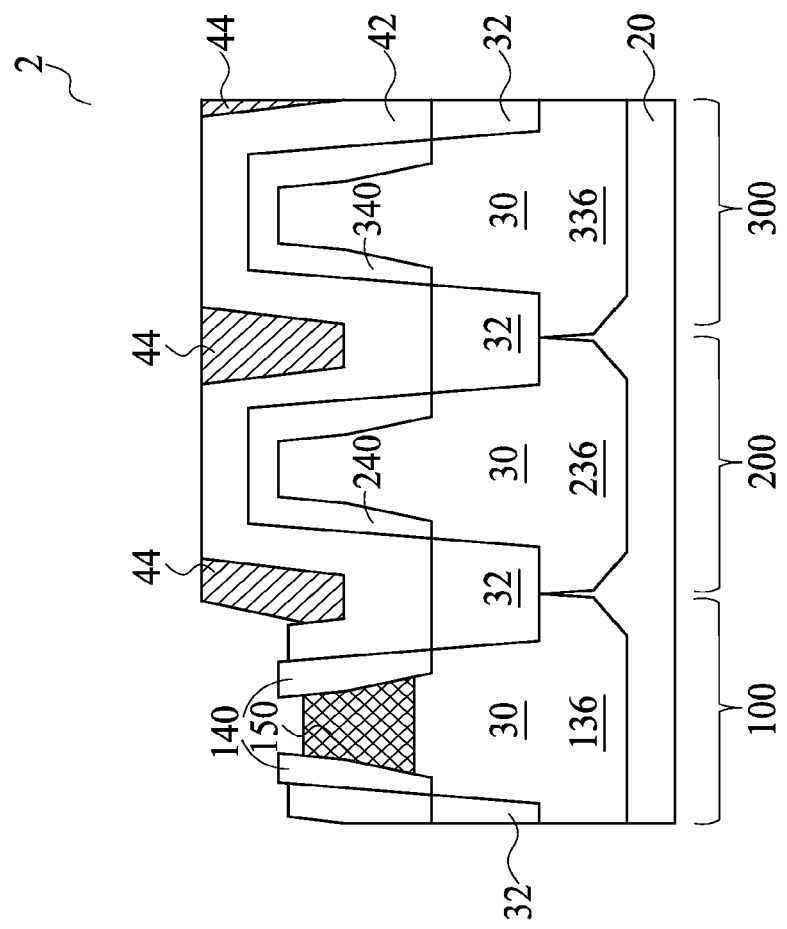

Referring to FIG. 11, semiconductor region 150 is grown in recess 148 (FIG. 10) through epitaxy, and the resulting semiconductor region 150 is a crystalline region. Semiconductor region 150 replaces the original fin 134 (FIG. 4), and is referred to as replacement fin 150 hereinafter. Replacement fin 150 may have a lattice constant (and a composition) different from the lattice constant (and the composition) of substrate 20. In some embodiments, replacement fin 150 comprises silicon germanium, which is expressed as $Si_{1-}$ $_x$Ge$_x$, wherein value X is the atomic percentage of germanium in replacement fin 150, which atomic percentage may be between about 0 (0 percent) and 1 (100 percent) in exemplary embodiments. Replacement fin 150 may also comprise pure germanium (when x is equal to 1) or substantially pure germanium (when x is greater than about 0.9, for example). Replacement fin 150 may also comprise a III-V compound semiconductor material, which comprises InAs, AlAs, GaAs, InP, GaN, InGaAs, InAlAs, GaSb, AlSb, AlP, GaP, and/or the like. Replacement fin 150 may be grown to a level lower than the top surfaces of the remaining oxide layer 140.

Figure 12:
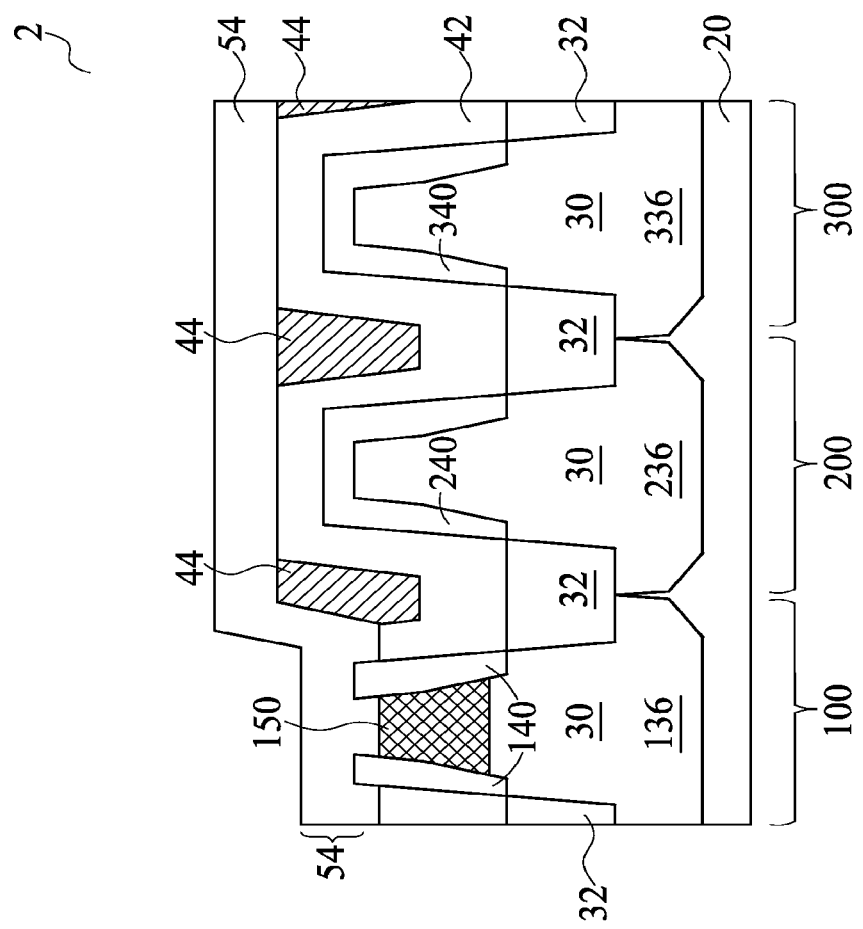
Figure 13:
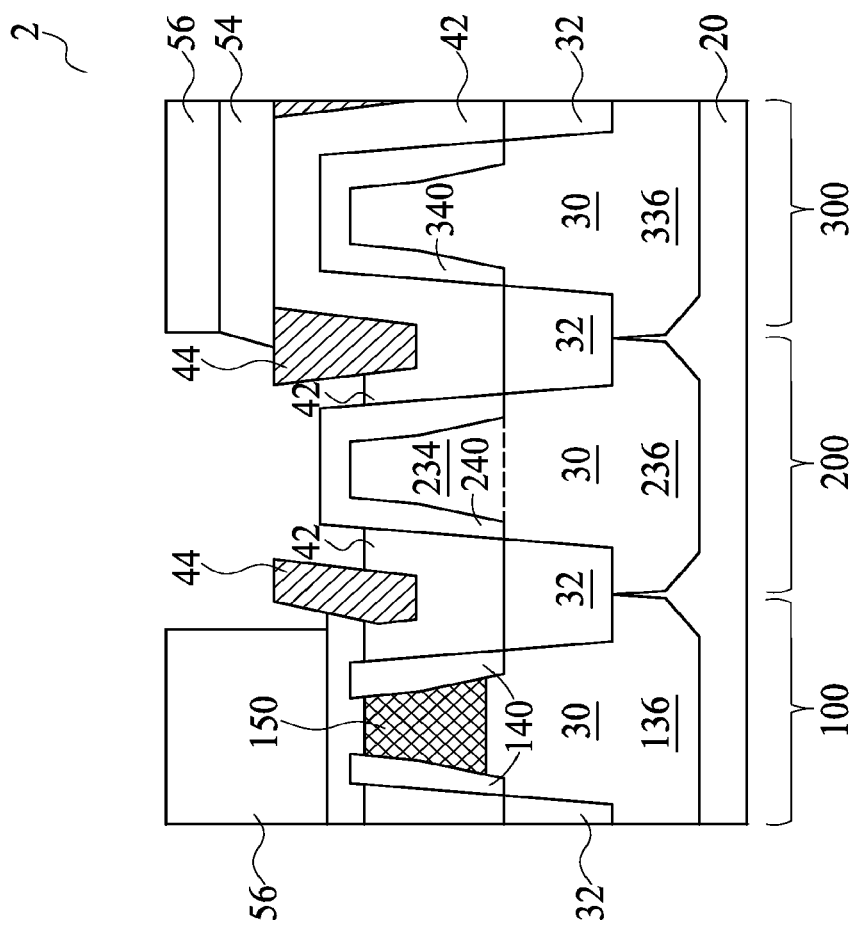
Figure 14:
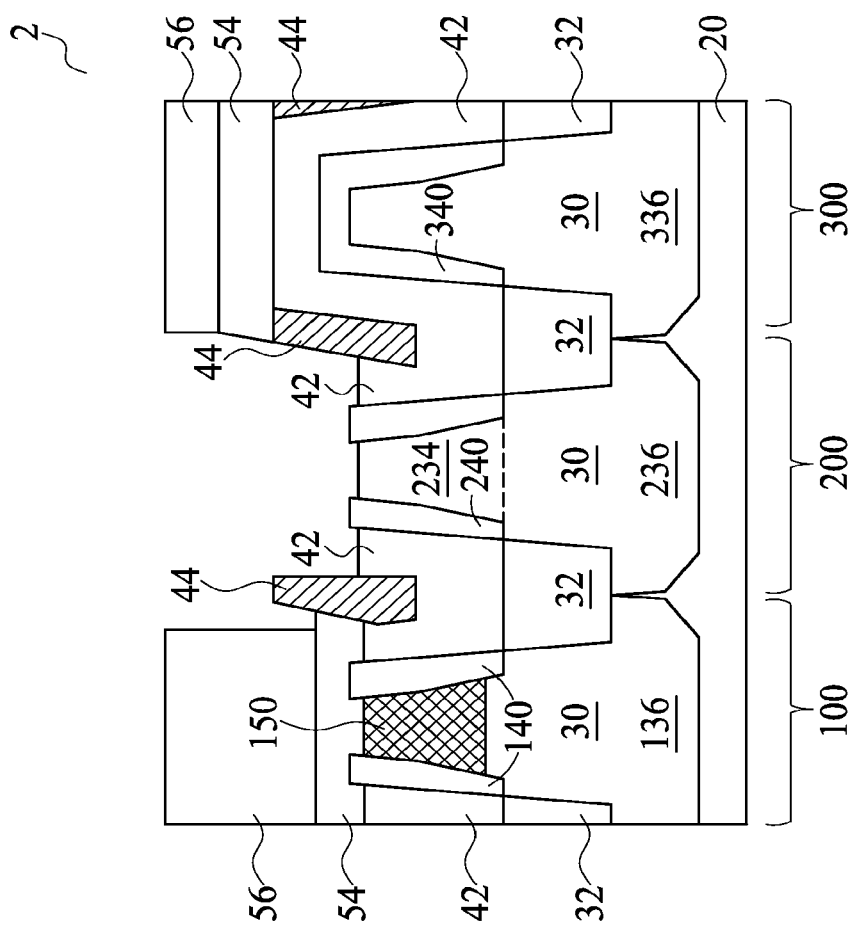
Figure 15:
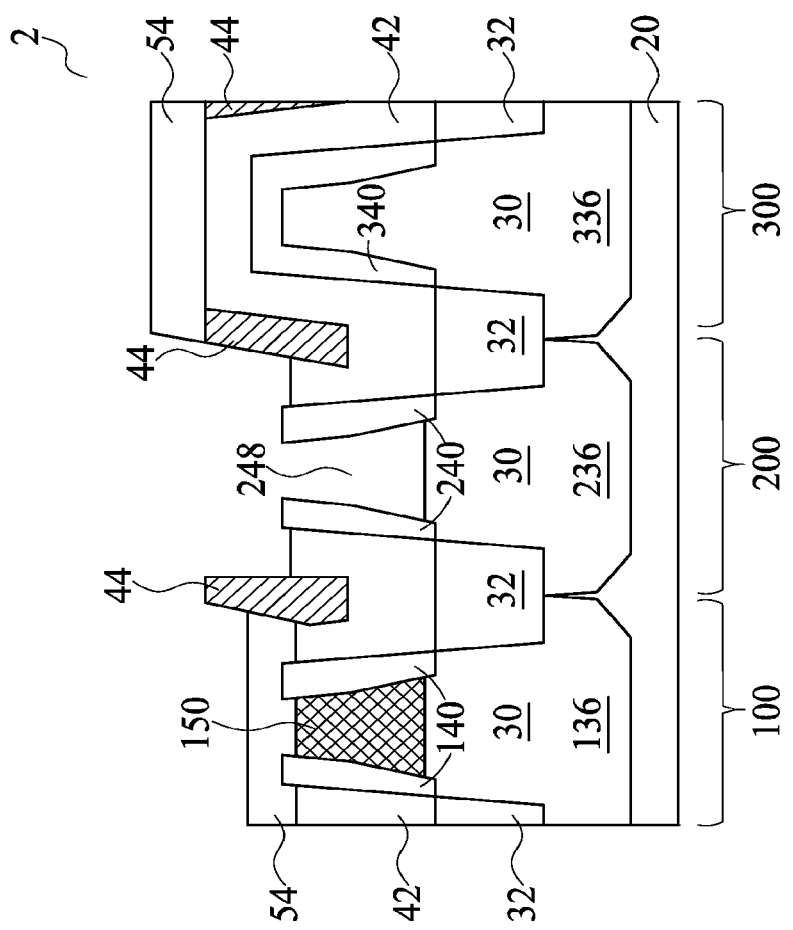

FIGS. 12-16 illustrate the formation of semiconductor region 250 (FIG. 16), which is also referred to as replacement fin 250 hereinafter. The formation process is similar to the formation of replacement fin 150, and the formation details may also be found referring to the formation of replacement fin 150. Referring to FIG. 12, hard mask layer 54 is formed to cover wafer 2. Hard mask layer 54 may be formed of a material selected from the candidate materials of hard mask layer 42. Next, as shown in FIG. 13, photo resist 56 is formed to cover the features in regions 100 and 300, while the features in region 200 are not covered. Similarly, hard mask layers 54 and 42 are etched, for example, in an anisotropic etching step, so that oxide layer 240 is exposed. As shown in FIG. 14, the exposed portions of oxides are etched, wherein the etched portions of oxides include the top portion of oxide layer 240 that covers fin 234 and possibly some portions of oxide regions 44. At least the majority, and possibly an entirety, of the sidewall portions of oxide layer 240, however, is not removed. As a result, the top surface of fin 234 is exposed. The exposed fin 234 is then etched, forming recess 248 between opposite sidewall portions of oxide layer 240, as shown in FIG. 15.

Figure 16:
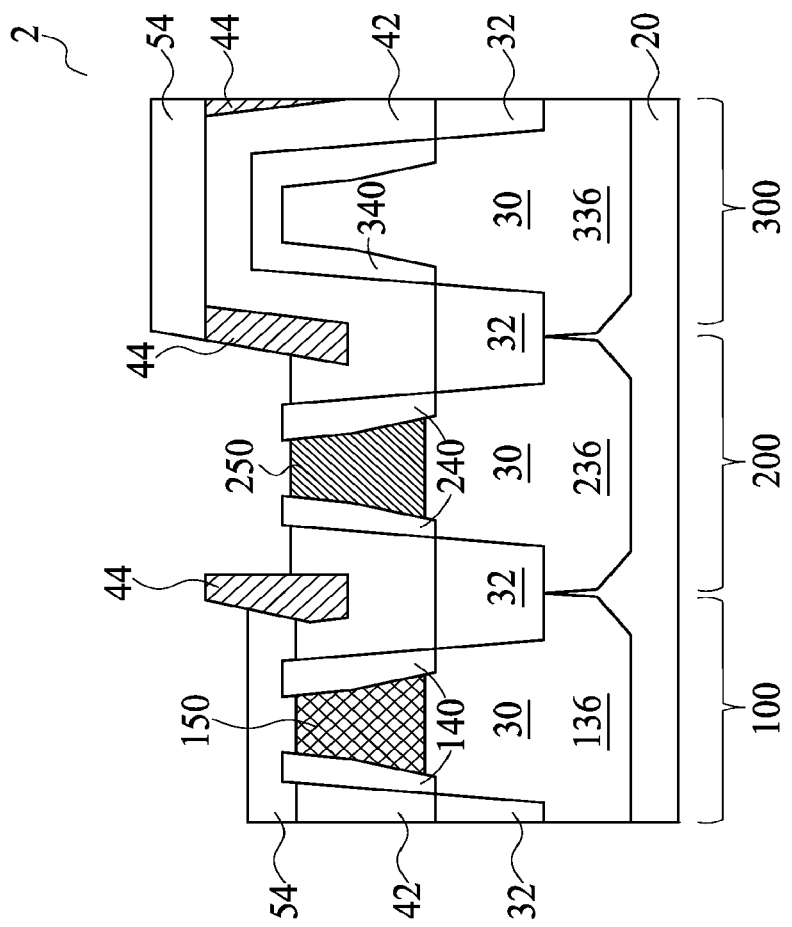

Referring to FIG. 16, replacement fin 250 is grown in recess 248 (FIG. 15) through epitaxy, and the resulting replacement fin 250 is a crystalline region. Replacement fin 250 may be selected from the same candidate materials for forming replacement fin 150, which may include Ge, SiGe, III-V compound semiconductor materials, or the like. The materials of replacement fins 150 and 250 may be the same or different from each other.

Figure 17:
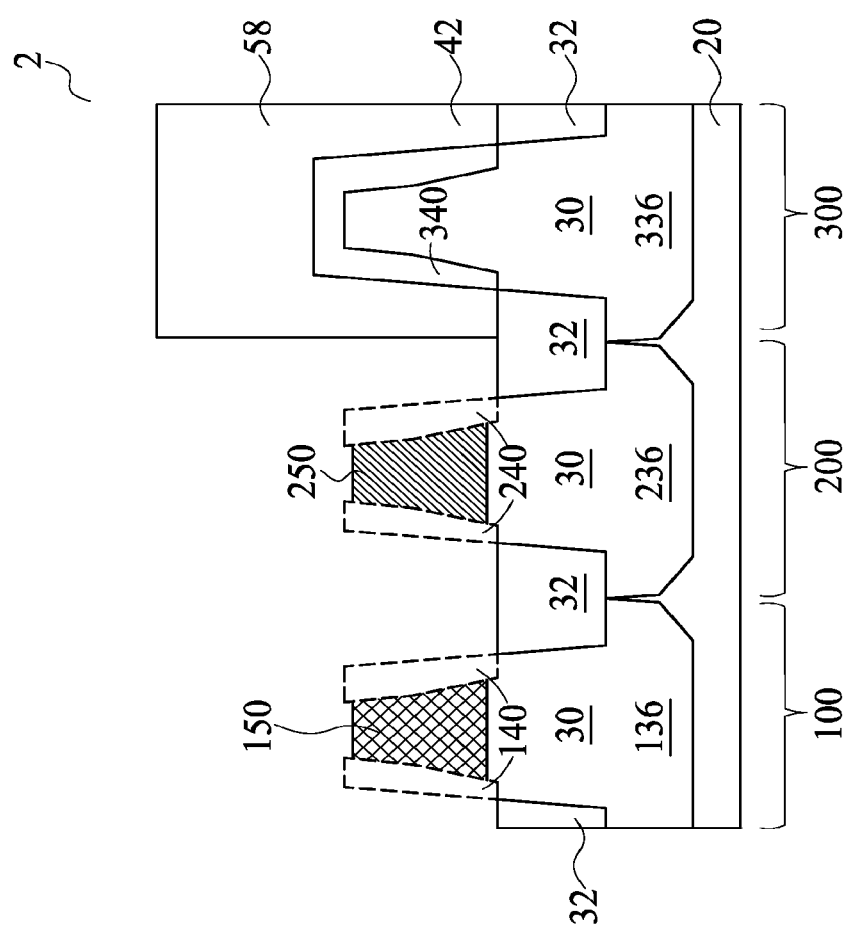
Figure 18:
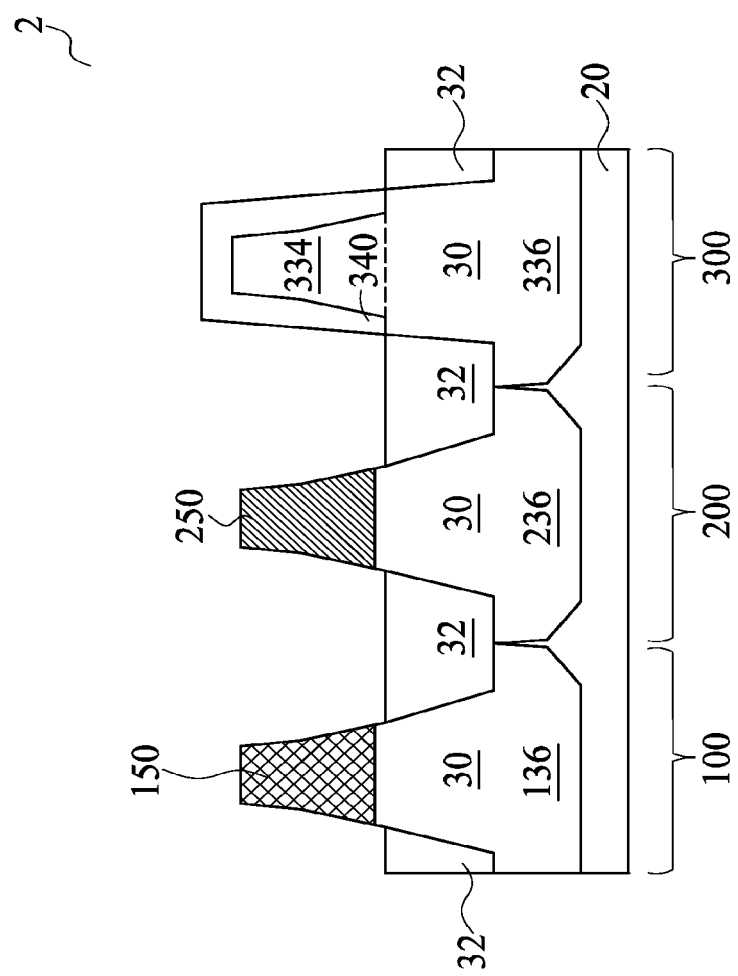

After the formation of replacement fin 250, oxide regions 44 are removed, followed by the removal of hard mask layers 54 and 42, leaving replacement fins 150 and 250 and oxide layers 140, 240, and 340. The result structure is shown in FIG. 17. Next, photo resist 58 is formed in region 300, and oxide layer 340 is covered by photo resist 58. The remaining portions of oxide layers 140 and 240 are hence exposed. An etching step is then performed to remove the remaining oxide layers 140 and 240, which are illustrated using dashed line to indicate their positions. Photo resist 58 is removed after the removal of oxide layers 140 and 240. The resulting structure is illustrated in FIG. 18. In between the process of FIG. 18 and FIG. 19, a thin layer of Si (not shown) may be grown on replacement fins 150 and 250. The purpose of the growth of the Si layer may be to form Quantum well FET for device 100/200.

Figure 19:
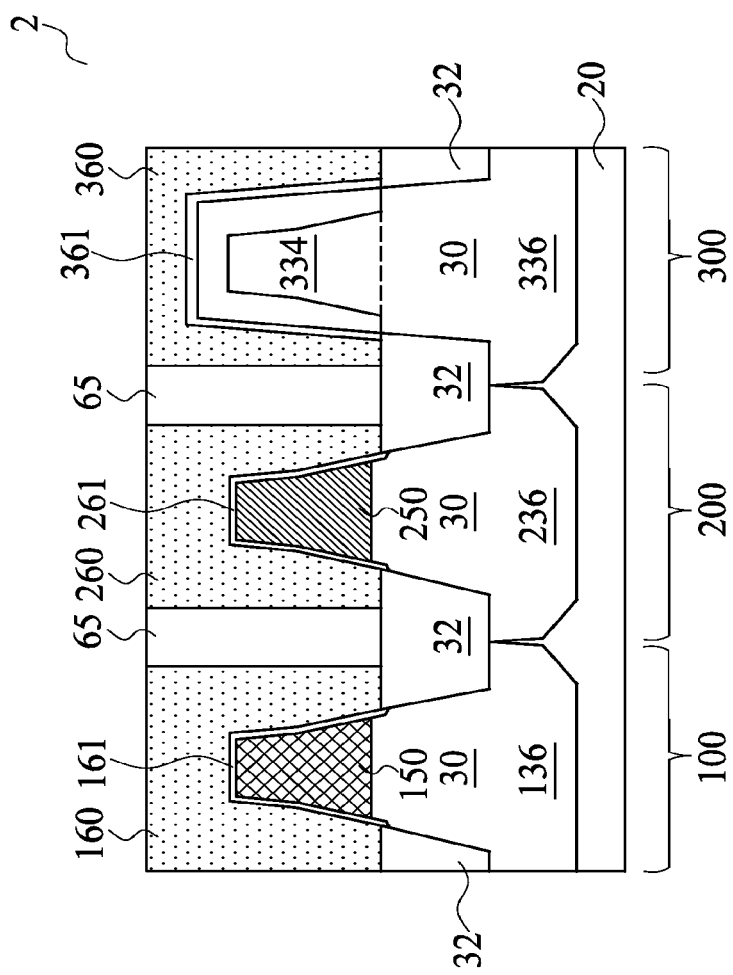
Figure 20:
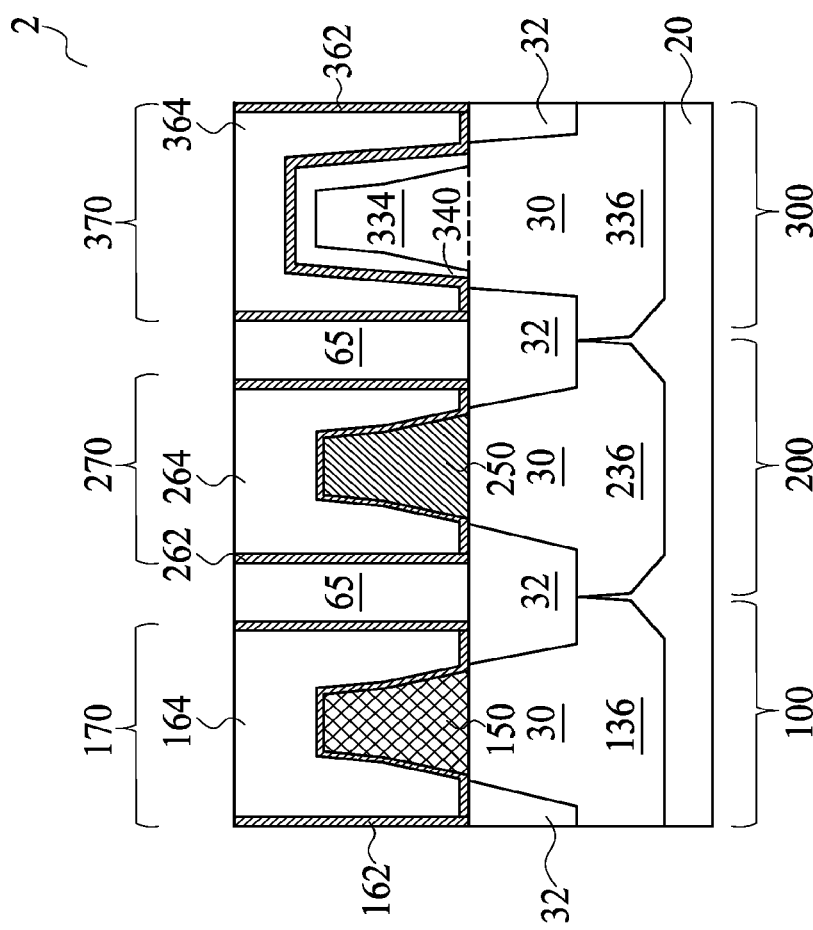

FIGS. 19 and 20 illustrate the formation of the remaining portions of FinFETs in regions 100, 200, and 300. Referring to FIG. 19, dummy gate electrodes 160, 260, and 360 are formed in regions 100, 200, and 300, respectively. Dummy gate electrodes 160, 260, and 360 may be formed of poly-silicon, for example. Dummy gate dielectrics 161, 261, and 361 may also be formed in some embodiments, or not formed in other embodiments. In subsequent steps, gate spacers (not shown) and Inter-Layer Dielectric (ILD) 65 are formed, wherein the top surface of the gate spacers and ILD 65 are level with the top surface of dummy gate electrodes 160, 260, and 360. Source and drain regions are formed in each of regions 100, 200, and 300, and on the opposite ends of each of the illustrate fins 150, 250, and 334. The source and drain regions are not in the illustrated plane, and hence are not shown.

Next, dummy gate electrodes 160, 260, and 360 and dummy gate dielectrics 161, 261, and 361 are removed. Referring to FIG. 20, dielectric layers 162, 262, and 362 and gate electrodes 164, 264, and 364 are formed, which form the replacement gates of the resulting FinFETs 170, 270, and 370, respectively. In the formation of the replacement gates, gate dielectric layers 162, 262, and 362 are formed in the recesses left by the removed dummy gate electrodes. Gate dielectric layers 162, 262, and 362 are also on the top surfaces and the sidewalls of the middle portions of semiconductor fins 152, and 252, and on the top of oxide layer 340. In accordance with some embodiments, gate dielectric layers 162, 262, and 362 comprise silicon oxide, silicon nitride, or multilayers thereof. In alternative embodiments, gate dielectric layers 162, 262, and 362 comprise a high-k dielectric material, and hence are alternatively referred to as high-k gate dielectric layers 162, 262, and 362 throughout the description. High-k gate dielectric layers 162, 262, and 362 may have a k value greater than about 7.0, and may include a metal oxide of Hf, Al, Zr, La, Mg, Ba, Ti, Pb, and combinations thereof. The formation methods of gate dielectric layers 162, 262, and 362 may include Molecular-Beam Deposition (MBD), Atomic Layer Deposition (ALD), Physical Vapor Deposition (PVD), and the like.

Next, a conductive material is formed over gate dielectric layer 162, 262, and 362 to form gate electrode 164, 264, and 364. Gate electrode 164, 264, and 364 may comprise a metal-containing material such as TiN, TaN, TaC, Co, Ru, Al, combinations thereof, and multi-layers thereof. FinFETs 170, 270, and 370 are hence formed in regions 100, 200, and 300, respectively.

In the embodiments of the present disclosure, thick oxide layer (for example, 340 in FIG. 20) are first formed, followed by the formation of the replacement fins. The formation of the oxide layer, which is a part of the IO FinFET, uses a high temperature process. The replacement fins comprise low-bandgap materials that cannot endure the high-temperature process for forming the thick oxide layer. In the embodiments, the replacement fins are formed after the formation of the thick oxide in an integrated manufacturing process.

In accordance with some embodiments, a method includes forming a first semiconductor fin, and oxidizing surface portions of the first semiconductor fin to form a first oxide layer. The first oxide layer includes a top portion overlapping the first semiconductor fin and sidewall portions on sidewalls of the first semiconductor fin. The top portion of the first oxide layer is then removed, wherein the sidewall portions of the first oxide layer remains after the removing. The top portion of the first semiconductor fin is removed to form a recess between the sidewall portions of the first oxide layer. An epitaxy is performed to grow a semiconductor region in the recess.

In accordance with other embodiments, a method includes forming a first semiconductor fin and a second semiconductor fin, and oxidizing surface portions of the first and the second semiconductor fins simultaneously to form a first oxide layer and a second oxide layer, respectively. The method further includes covering the second oxide layer, removing a top portion of the first oxide layer to expose the first semiconductor fin, removing a top portion of the first semiconductor fin to form a recess between opposite sidewall portions of the first oxide layer, performing an epitaxy to grow a semiconductor region in the recess, removing remaining portions of the first oxide layer, forming a first gate dielectric on a top surface and sidewalls of the semiconductor region, forming a first gate electrode over the first gate dielectric, and forming a second gate electrode over the second oxide layer.

In accordance with yet other embodiments, a method includes forming a first, a second, and a third semiconductor fin in a first, a second, and a third device region, respectively, and simultaneously oxidizing a top portion and sidewall portions of each of the first, the second, and the third semiconductor fins to form a first, a second, and a third oxide layer, respectively. The method further includes replacing a top portion of the first semiconductor fin with a first replacement fin, replacing a top portion of the second semiconductor fin with a second replacement fin, and removing remaining portions of the first and the second oxide layers without removing the third oxide layer. A first gate dielectric is formed to form a first Fin Field-Effect Transistor (FinFET), wherein the first gate dielectric is on a top surface and sidewalls of the first replacement fin. A second gate dielectric is formed to form a second FinFET, wherein the second gate dielectric is on a top surface and sidewalls of the second replacement fin. A third gate dielectric is formed to form a third FinFET, wherein the third gate dielectric is on a top surface and sidewalls of the third oxide layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first, a second, and a third semiconductor fin;
    simultaneously oxidizing sidewall portions of the first, the second, and the third semiconductor fins to form a first, a second, and a third oxide layer, respectively;
    replacing a top portion of the first semiconductor fin with a first replacement fin;
    replacing a top portion of the second semiconductor fin with a second replacement fin;
    removing the first and the second oxide layers without removing the third oxide layer;
    forming a first gate dielectric on a top surface and sidewalls of the first replacement fin;
    forming a second gate dielectric on a top surface and sidewalls of the second replacement fin; and
    forming a third gate dielectric on a top surface and sidewalls of the third oxide layer.

2. The method of claim 1, wherein the replacing the top portion of the first semiconductor fin comprises:
    removing a top portion of the first oxide layer, wherein sidewall portions of the first oxide layer remain after the removing;
    etching the top portion of the first semiconductor fin to form a recess between the sidewall portions of the first oxide layer; and
    epitaxially growing the first replacement fin in the recess.

3. The method of claim 1 further comprising:
    forming a hard mask layer to cover the first, the second, and the third oxide layers; and
    performing a lithography step to form an opening in the hard mask layer, wherein the first oxide layer is exposed to the opening.

4. The method of claim 3 further comprising:
    forming an additional oxide layer over the hard mask layer; and
    performing a planarization to remove portions of the additional oxide layer that are higher than a top surface of the hard mask layer, wherein the top surface of the hard mask layer is level with top surfaces of remaining portions of the additional oxide layer.

5. The method of claim 1, wherein the oxidizing comprises a thermal oxidation.

6. The method of claim 5, wherein the thermal oxidation is performed at a temperature higher than about 800° C.

7. The method of claim 1 further comprising forming a gate electrode on each of the first gate dielectric, the second gate dielectric, and the third gate dielectric.

8. A method comprising:
    forming a silicon fin protruding higher than Shallow Trench Isolation (STI) regions, wherein the STI regions comprise portions on opposite sides of the silicon fin;
    oxidizing a top surface portion and sidewall surface portions of the silicon fin to form a first silicon oxide layer;
    forming a mask layer comprising:
        sidewall portions on sidewalls of the first silicon oxide layer; and
        a top portion overlapping the first silicon oxide layer;
    forming a second silicon oxide layer filling recesses that extend into the mask layer, wherein a top portion of the mask layer that overlaps the silicon fin is exposed;
    etching the top portion of the mask layer and a top portion of the first silicon oxide layer to expose the silicon fin;
    removing a top portion of the silicon fin to form a recess; and
    re-growing a replacement fin in the recess.

9. The method of claim 8 further comprising, after the replacement fin is formed, removing remaining portions of the first silicon oxide layer.

10. The method of claim 8 further comprising, after the replacement fin is formed, removing remaining portions of the second silicon oxide layer.

11. The method of claim 8, wherein the forming the second silicon oxide layer and the forming the mask layer comprises a Chemical Mechanical Polish (CMP).

12. The method of claim 8 further comprising:
    forming a gate dielectric over the silicon fin; and
    forming a gate electrode over the gate dielectric.

13. The method of claim 8, wherein the recess is defined by opposite portions of the first silicon oxide layer.

14. The method of claim 8, wherein the replacement fin comprises a material different from silicon.

15. A method comprising:
forming a first, a second, and a third semiconductor fin;
oxidizing sidewall portions of the first, the second, and the third semiconductor fins to form a first, a second, and a third oxide layer, respectively;
replacing a top portion of the first semiconductor fin with a first replacement fin, wherein the replacing the top portion of the first semiconductor fin comprises:
  removing a top portion of the first oxide layer covering the first semiconductor fin;
  etching the top portion of the first semiconductor fin to form a recess between remaining sidewall portions of the first oxide layer; and
  growing the first replacement fin in the recess;
replacing a top portion of the second semiconductor fin with a second replacement fin;
removing the first and the second oxide layers without removing the third oxide layer;
forming a first gate dielectric on a top surface and sidewalls of the first replacement fin;
forming a second gate dielectric on a top surface and sidewalls of the second replacement fin; and
forming a third gate dielectric on a top surface and sidewalls of the third oxide layer.

16. The method of claim 15 further comprising:
forming a hard mask layer to cover the first, the second, and the third oxide layers; and
performing a lithography step to form an opening in the hard mask layer, wherein the top portion of the first oxide layer is removed through the opening.

17. The method of claim 16 further comprising:
forming an additional oxide layer over the hard mask layer; and
performing a planarization to remove portions of the additional oxide layer that are higher than a top surface of the hard mask layer, wherein the top surface of the hard mask layer is level with top surfaces of remaining portions of the additional oxide layer.

18. The method of claim 15, wherein the oxidizing comprises a thermal oxidation.

19. The method of claim 18, wherein the thermal oxidation is performed at a temperature higher than about 800° C.

20. The method of claim 15 further comprising forming a gate electrode on each of the first gate dielectric, the second gate dielectric, and the third gate dielectric.

* * * * *